(12) United States Patent
Huang

(10) Patent No.: US 12,051,572 B2
(45) Date of Patent: Jul. 30, 2024

(54) SEMICONDUCTOR MANUFACTURING APPARATUS AND METHOD FOR CLEANING OFF DEPOSIT IN CHAMBER OF SAME

(71) Applicant: CHANGXIN MEMORY TECHNOLOGIES, INC., Hefei (CN)

(72) Inventor: Wulin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 237 days.

(21) Appl. No.: 17/455,994

(22) Filed: Nov. 22, 2021

(65) Prior Publication Data

US 2023/0014234 A1 Jan. 19, 2023

Related U.S. Application Data

(63) Continuation of application No. PCT/CN2021/111478, filed on Aug. 9, 2021.

(30) Foreign Application Priority Data

Jul. 16, 2021 (CN) .......................... 20211006045.8

(51) Int. Cl.
*H01J 37/32* (2006.01)
(52) U.S. Cl.
CPC .. *H01J 37/32862* (2013.01); *H01J 37/32174* (2013.01); *H01J 37/32568* (2013.01); *H01J 37/32807* (2013.01); *H01J 37/3288* (2013.01); *H01J 37/32972* (2013.01)

(58) Field of Classification Search
CPC ........... H01J 37/32174; H01J 37/32568; H01J 37/32807; H01J 37/32972; H01J 37/32862; H01J 37/3288
See application file for complete search history.

(56) References Cited

U.S. PATENT DOCUMENTS

| 4,988,533 A | 1/1991 | Freeman et al. |
| 5,240,555 A | 8/1993 | Kilburn |
| 5,986,747 A * | 11/1999 | Moran .................... G01N 21/68 |
| | | 216/60 |

(Continued)

FOREIGN PATENT DOCUMENTS

| CN | 1842242 A | 10/2006 |
| CN | 100591190 C | 2/2010 |

(Continued)

OTHER PUBLICATIONS

International Search Report as cited in PCT/CN2021/111478 mailed Apr. 13, 2022, 9 pages.

*Primary Examiner* — Yuechuan Yu
(74) *Attorney, Agent, or Firm* — Kilpatrick Townsend & Stockton LLP

(57) ABSTRACT

The present application discloses a semiconductor manufacturing apparatus, including: a chamber including an inner chamber, an outer chamber and a passage communicating the inner chamber with the outer chamber, the passage being located between the inner chamber and a chamber sidewall; and one or more electrodes disposed in the chamber sidewall and configured to ionize a treating gas coming from the inner chamber to generate plasma so as to clean off deposit produced in the inner chamber.

15 Claims, 2 Drawing Sheets

(56) References Cited

U.S. PATENT DOCUMENTS

| | | | |
|---|---|---|---|
| 2003/0129835 A1 | 7/2003 | Kholodenko et al. | |
| 2004/0060516 A1* | 4/2004 | Nishimoto | H01J 37/32458 427/282 |
| 2005/0000443 A1* | 1/2005 | Kim | H01J 37/321 118/723 I |
| 2006/0211243 A1 | 9/2006 | Ishizaka et al. | |
| 2008/0179297 A1* | 7/2008 | Bailey | H01J 37/32366 219/69.15 |

FOREIGN PATENT DOCUMENTS

| | | |
|---|---|---|
| CN | 102154630 A | 8/2011 |
| CN | 103311149 A | 9/2013 |
| CN | 109671609 A | 4/2019 |
| CN | 109671609 B | 1/2021 |

* cited by examiner

SEMICONDUCTOR MANUFACTURING APPARATUS AND METHOD FOR CLEANING OFF DEPOSIT IN CHAMBER OF SAME

CROSS-REFERENCE TO RELATED APPLICATIONS

This application is a continuation application of International Patent Application No. PCT/CN2021/111478, filed on Aug. 9, 2021, which claims priority to Chinese Patent Application No. 202110806045.8, filed with the Chinese Patent Office on Jul. 16, 2021 and entitled "SEMICONDUCTOR MANUFACTURING APPARATUS AND METHOD FOR CLEANING OFF DEPOSIT IN CHAMBER OF SAME." International Patent Application No. PCT/CN2021/111478 and Chinese Patent Application No. 202110806045.8 are incorporated herein by reference in their entireties.

TECHNICAL FIELD

The present application relates to the field of manufacturing technologies for semiconductor devices, and in particular, to a cleaning technique and apparatus in the process of semiconductor preparation.

BACKGROUND

During the long-term operation of a semiconductor manufacturing apparatus, a great deal of polymer deposit can be accumulated on a sidewall of a chamber of the apparatus. When a deposit scraping method is employed for cleaning, a large quantity of dust particles will be produced. The large quantity of tiny dust particles not only affect subsequent production resumption, but also may affect a gas circulation and treatment system of a manufacturing shop. In addition, if an operator near the manufacturing apparatus inhales the dust particles, the body will also be affected. Due to the long-term use of scrapers, the conventional deposit scraping method may cause coatings of the chamber of the apparatus to be thinned and scratched, resulting in the damage to the operating environment of the apparatus. Therefore, how to clean off deposit on an inner wall of a chamber of a semiconductor manufacturing apparatus, particularly at high efficiency and high precision, is a problem urgent to be solved at present.

SUMMARY

A first aspect of the present application provides a semiconductor manufacturing apparatus, including: a chamber including an inner chamber, an outer chamber and a passage communicating the inner chamber with the outer chamber, the passage being located between the inner chamber and a chamber sidewall; and one or more electrodes disposed in the chamber sidewall and configured to ionize a treating gas coming from the inner chamber to generate plasma so as to clean off deposit produced in the inner chamber.

A second aspect of the present application provides a method for cleaning off deposit in a chamber of a semiconductor manufacturing apparatus, including: providing the semiconductor manufacturing apparatus described in the aforementioned embodiment, and injecting a treating gas into the chamber of the semiconductor manufacturing apparatus, so that the treating gas flows from the inner chamber to the outer chamber via the passage communicating the inner chamber with the outer chamber; and outputting a high-frequency signal and a low-frequency signal to the one or more electrodes in the chamber sidewall, the high-frequency signal being used for ionizing the treating gas coming from the inner chamber to generate plasma and the low-frequency signal being used for controlling the plasma to clean off deposit in the chamber.

BRIEF DESCRIPTION OF DRAWINGS

In order to more clearly illustrate the technical solutions in embodiments of the present application or a prior art, the accompanying drawings required to be used in the description of the embodiments will be briefly introduced below. Apparently, the accompanying drawings in the following description only show some embodiments of the present application, and those of ordinary skill in the art can still derive other drawings from these accompanying drawings without creative efforts.

DESCRIPTION OF EMBODIMENTS

Figure 1:
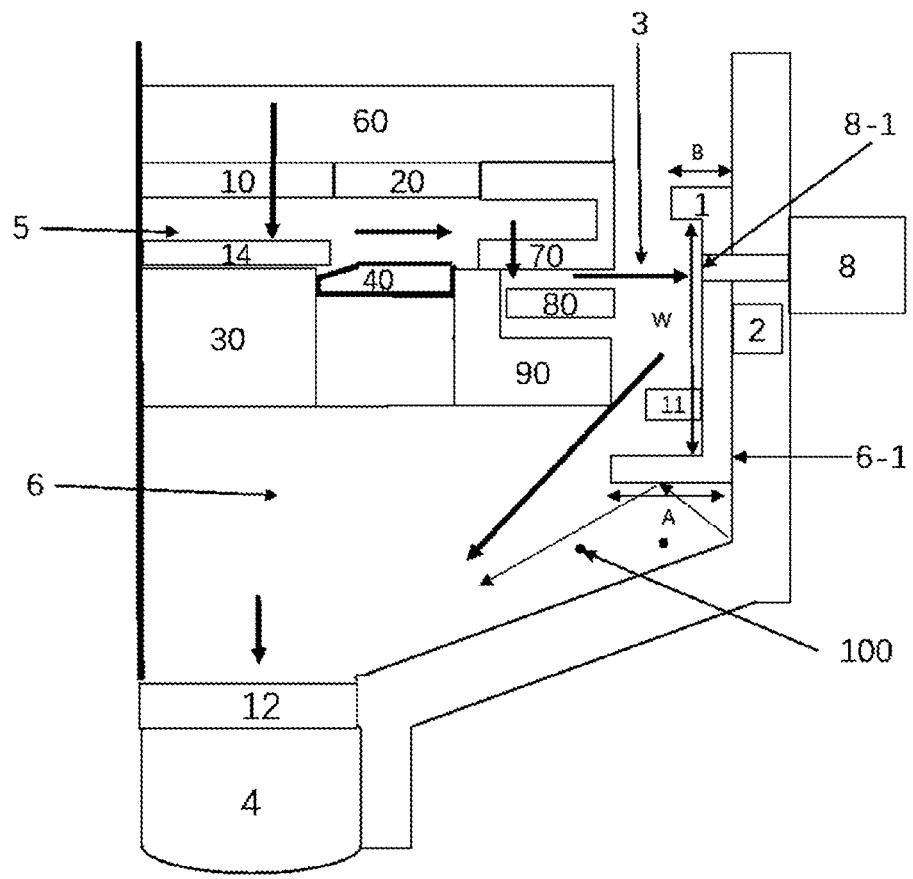
FIG. 1 is a schematic structural diagram of a semiconductor manufacturing apparatus according to one embodiment of the present application.

In order to make the object, technical solution and advantages of the present application clearer, the present application will be further described in detail below in conjunction with specific embodiments and with reference to the accompanying drawings. It should be understood that these descriptions are merely exemplary rather than intended to limit the scope of the present application. In addition, descriptions of well-known structures and technologies are omitted in the following description in order to avoid the unnecessary confusion of the concept of the present application.

Schematic diagrams of layer structures according to embodiments of the present application are shown in the accompanying drawings. These drawings are not drawn to scale. For the sake of clarity, some details are amplified, and some details may be omitted. The shapes of various regions and layers and the relative size and position relationships between them shown in the drawings are merely exemplary, and may have errors to some extent in practice due to manufacturing tolerances or technical limitations, and those skilled in the art can additionally design regions/layers with different shapes, sizes and relative positions as actually required.

Apparently, the embodiments described are part of the embodiments of the present application rather than all the embodiments. All other embodiments which are obtained by those of ordinary skill in the art based on the embodiments in the present application without creative efforts shall fall within the protection scope of the present application.

FIG. 1 is a schematic structural diagram of a semiconductor manufacturing apparatus according to one embodiment of the present application.

As shown in FIG. 1, a chamber of the semiconductor manufacturing apparatus of the present embodiment is divided into an inner chamber 5, an outer chamber 6 and a passage 3 communicating the inner chamber with the outer chamber. The inner chamber 5 is a reaction chamber defined by an electrostatic chuck 30, an inner electrode ring 10, an outer electrode ring 20, a C-shroud 70, an edge cooling ring 40 and other parts, with a fixing plate 60 used for the inner electrode ring 10 and the outer electrode ring 20. The passage 3 guides a treating gas to the outer chamber 6 from the inner chamber 5, and is located between the inner chamber 5 and a chamber sidewall 6-1. The outer chamber 6 is a space formed by the closed chamber sidewall 6-1, and one or more electrodes 2 are disposed in the chamber sidewall 6-1 for ionizing the treating gas coming from the inner chamber 5 to generate plasma when electrified, so as to clean off deposit produced in the inner chamber 5. As shown in FIG. 1, the treating gas in the chamber is excited by a strong signal field generated by the electrodes 2 to generate the plasma, which cleans off the deposit produced by reaction in the inner chamber 5, that is, the plasma reacts with the deposit in the chamber physically and chemically, so that the deposit comes off.

It should be noted that in the field of plasma application, on the one hand, a plasma etching and cleaning technique utilizes active particles to bombard a surface to be cleaned, so that contaminant comes off, and on the other hand, the active particles react with surface impurities to produce volatile substances, so that the contaminant comes off. That is, the plasma reacts with the contaminant both physically and chemically. Because the electrodes 2 generate different signals, different plasmas can be excited, producing different etching and cleaning effects.

Frequency at the magnitude of KHz can excite ultrasonic plasma, frequency at the magnitude of MHz can excite radio-frequency plasma, and frequency at the magnitude of GHz can excite microwave plasma. These three types of plasmas can all perform etching and cleaning. The difference is in that the reaction between the ultrasonic plasma and the deposit is mainly physical reaction, the reaction between the radio-frequency plasma and the deposit is both physical reaction and chemical reaction, and the reaction between the microwave plasma and the deposit is mainly chemical reaction. In addition, different compositions of the treating gas will lead to different reactions between the plasma and the deposit. Optionally, the treating gas is a gas containing a fluorine component, and signals generated by the electrodes 2 ionize the treating gas to generate fluorine ions, which have strong oxidizability and can carry out intense chemical reaction with the deposit, thus achieving the effect of etching and cleaning the deposit.

The embodiments of the present application can/at least have the following advantages: by disposing the electrodes in the chamber of semiconductor manufacturing apparatus to generate the plasma of the treating gas, the plasma can etch and clean off deposit in the chamber, thus alleviating an adverse influence of the conventional scraping and cleaning method on the apparatus, a working environment and personnel.

In an alternative embodiment, the electrodes 2 are disposed in the chamber sidewall 6-1 and exposed in the treating gas of the chamber for cleaning off the deposit attached to the chamber sidewall 6-1. Since the passage 3 is located between the inner chamber 5 and the chamber sidewall 6-1, the plasma generated in the inner chamber 5 can directly act on the chamber sidewall 6-1, so as to achieve the technical effect of cleaning off the deposit.

In an alternative embodiment, referring to FIG. 1, the semiconductor manufacturing apparatus further includes: an isolating ring 1 disposed on the chamber sidewall 6-1 and in the passage 3 and configured to isolate the deposit coming from the inner chamber 5 from contaminating the chamber sidewall 6-1. Since the deposit flowing out of the inner chamber 5 cannot directly contact the chamber sidewall 6-1, the isolating ring 1 isolates the deposit coming from the inner chamber from contaminating the chamber sidewall 6-1. The one or more electrodes 2 are configured to generate plasma to clean off the deposit attached to the isolating ring 1; the deposit coming from the inner chamber 5 is isolated on the isolating ring 1, so a great deal of deposit will be accumulated on the isolating ring 1; and in addition, the deposit can also be cleaned off in time by generating plasma.

Figure 2:
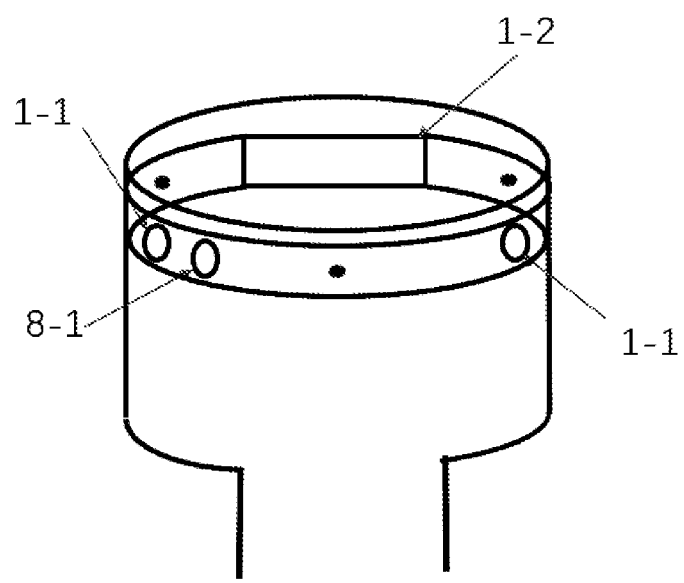
FIG. 2 is a schematic diagram of a position of an isolating ring of the semiconductor manufacturing apparatus in a chamber according to the embodiment of the present application.

FIG. 2 is a schematic diagram of a position of the isolating ring of the semiconductor manufacturing apparatus in the chamber according to the embodiment of the present application.

In an alternative embodiment, referring to FIG. 1 and FIG. 2, the isolating ring 1 is a circular ring disposed around the chamber sidewall 6-1, and a longitudinal section of the isolating ring 1 is shaped like a C, an upper end of which is short and a lower end of which is long. The upper end and lower end of the C shape surround the treating gas flowing out of the inner chamber 5, so that deposit can be blocked from diffusing in a vertical direction in FIG. 1, and consequently, the contamination of the chamber sidewall 6-1 by the deposit can be alleviated. Since the isolating ring 1 is a circular ring surrounding the chamber sidewall 6-1 by 360 degrees, the contamination of the chamber sidewall 6-1 by the deposit is alleviated to the max.

Referring to FIG. 1, a height of the longitudinal section of the isolating ring 1 is W, a length of the upper end is B, and a length of the lower end is A. Exemplarily, W is equal to 8 cm, B is equal to 7 mm, and A is equal to 15 mm. The purpose of setting the length of the lower end to be greater than that of the upper end is to block deposit particles 100 from returning into the inner chamber 5 along the passage 3, and the reason why the length of the upper end is smaller is to facilitate the dismounting, mounting and maintenance of the C-shroud 70. Alternatively, the length of the lower end of the isolating ring 1 is set to be greater than or equal to one of the following distances: a distance from an edge of the inner chamber 5 to the chamber sidewall 6-1, a distance from the C-shroud 70 to the chamber sidewall 6-1, a distance from a limiting ring 80 to the chamber sidewall 6-1, and a distance from a ground ring 90 to the chamber sidewall 6-1. Thus, polymer particles flowing out of the inner chamber 5 are blocked to the max, so that the deposit flowing out of the inner chamber 5 falls on the isolating ring 1 and the deposit particles 100 are blocked from returning into the inner chamber 5 along the passage 3.

In an alternative embodiment, the isolating ring 1 is provided with a yttrium oxide coating. It should be noted that yttrium oxide has highly stable chemical properties and excellent plasma etching resistance, and the coating has a good protective effect on the isolating ring 1. The yttrium oxide coating is dense and low in porosity, and can resist high temperature and gas corrosion. Therefore, when the isolating ring 1 is provided with the yttrium oxide coating, as deposit is etched and cleaned off by a plasma gas, the plasma is unable to etch the isolating ring 1 because of isolation by the yttrium oxide coating, thus protecting the isolating ring 1.

In an alternative embodiment, the isolating ring 1 is detachable. As shown in FIG. 1, the isolating ring 1 is fixed on the chamber sidewall 6-1 by screws 11. The isolating ring 1 can be conveniently replaced or dismounted for cleaning because of screw connection.

Figure 3:
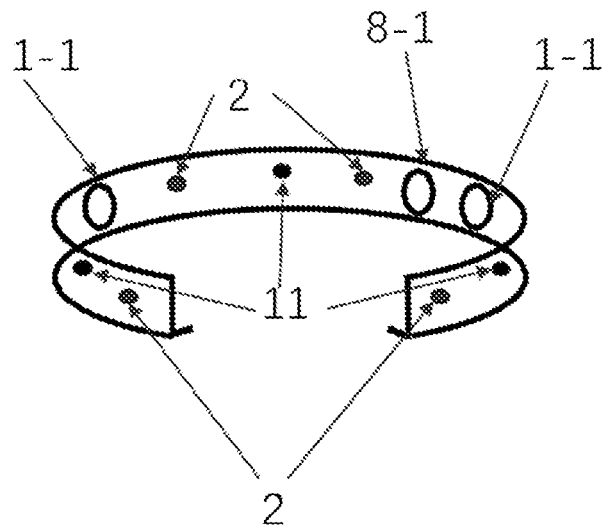
FIG. 3 is a schematic structural diagram of the isolating ring of the semiconductor manufacturing apparatus according to the embodiment of the present application.

FIG. 3 is a schematic structural diagram of the isolating ring of the semiconductor manufacturing apparatus according to the embodiment of the present application.

As shown in FIGS. 2 and 3, holes 1-1 and an opening 1-2 are formed in the isolating ring 1, the holes 1-1 run through the isolating ring 1 and the chamber sidewall 6-1, and the electrodes 2 are distributed on the periphery of the isolating ring 1.

In an alternative embodiment, the isolating ring 1 is provided with an opening, which is configured for transfer of a wafer. Referring to FIG. 3, the isolating ring 1 is a circular ring with a C-shaped cross section. The opening portion of the C-shaped isolating ring is provided with the opening 1-2, and when the opening 1-2 is in an open state, a wafer 14 in FIG. 1 is sent into the inner chamber 5. For the sake of a position for transferring the wafer 14, the isolating ring 1 is configured as a circular ring with an opening.

In an alternative embodiment, referring to FIG. 2 and FIG. 3, the isolating ring 1 is provided with a plurality of holes 1-1, which include visible windows to facilitate the observation of the interior of the chamber.

In an alternative embodiment, referring to FIG. 1, the semiconductor manufacturing apparatus further includes: a suction pump 4 disposed at the bottom of the chamber and configured to pump away the deposit removed from the sidewall of the outer chamber 6 and the isolating ring 1. Referring to FIG. 1, the deposit and residual reactive gas are pumped out of the chamber by the suction pump 4, and a limiting valve 12 is disposed at the suction pump 4, so that the deposit flows unidirectionally.

Figure 4:
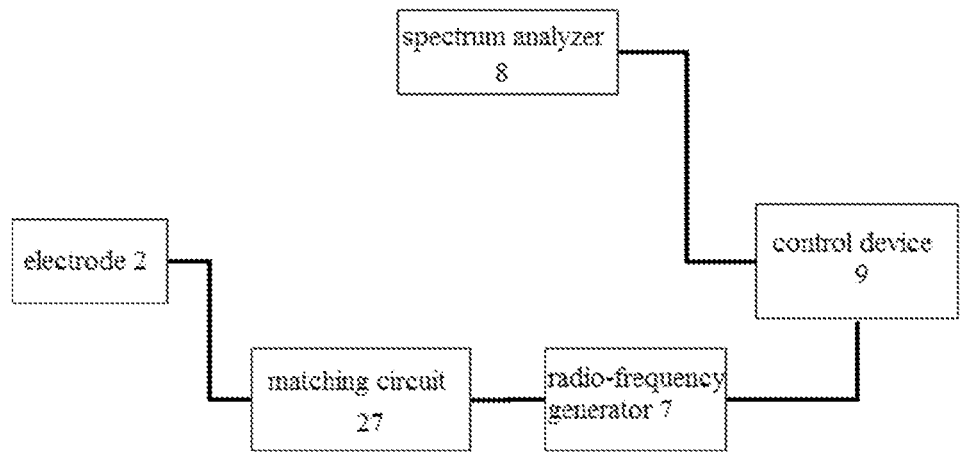
FIG. 4 is a schematic diagram of a connection principle of a control device of the semiconductor manufacturing apparatus according to the embodiment of the present application.

FIG. 4 is a schematic diagram of a connection principle of a control device of the semiconductor manufacturing apparatus according to the embodiment of the present application.

As shown in FIG. 4, a radio-frequency generator 7 is connected to the electrodes 2 through a matching circuit 27, and the control device 9 is connected to a spectrum analyzer 8 and the radio-frequency generator 7.

In an alternative embodiment, the radio-frequency generator 7 is electrically connected to the electrodes 2 for supplying an oscillating current to the electrodes 2. It should be noted that the radio-frequency signal is a high-frequency oscillating current, and different oscillation frequencies produce different plasma effects, such as ultrasonic plasma, radio-frequency plasma and microwave plasma. Optionally, the radio-frequency generator 7 is a signal generator or a power generator in the field of radio-frequency signals. In some embodiments, the power of the radio-frequency generator 7 is set to 500 W. Generally speaking, the greater a plasma discharge power, the greater the intensity of etching and cleaning off the deposit. The intensity of etching and cleaning off the deposit can be regulated by increasing or decreasing the power output by the radio-frequency generator. On the other hand, it should also be considered that excessive power may also cause etching of the components in the chamber, so the radio-frequency generator 7 is required to be regulated within a power range protecting the components in the chamber.

Optionally, the matching circuit 27 is also disposed between the radio-frequency generator 7 and the electrodes 2. Referring to FIG. 4, the radio-frequency generator 7 is not directly connected to the electrodes 2, but is connected to the electrodes 2 through the matching circuit 27. In the field of radio frequency application, the function of the matching circuit is to reduce reflected power, so as to maximize transmission power.

In an alternative embodiment, the radio-frequency generator 7 generates a high-frequency signal, a frequency of which ranges from 50 MHz to 70 MHz. Exemplarily, a frequency of the high-frequency signal is 60 MHz. The high-frequency signal causes the electrodes 2 to excite high-frequency electrons, which ionize molecules of the treating gas by impact to generate a large amount of plasma.

In an alternative embodiment, the radio-frequency generator 7 generates a low-frequency signal, a frequency of which ranges from 1 MHz to 3 MHz. Exemplarily, a frequency of the low-frequency signal is 2 MHz. The low-frequency signal is used to control the electrodes 2 to excite low-frequency electrons, and the generated plasma is driven to physically bombard deposit in a region where the electrodes 2 are located, including deposit on the sidewall of the outer chamber 6 where the electrodes 2 are located and deposit on the isolating ring 1.

In an alternative embodiment, referring to FIG. 1 and FIG. 4, the semiconductor manufacturing apparatus further includes: the spectrum analyzer 8 disposed outside the chamber sidewall 6-1 and configured to detect whether deposit has been completely cleaned off. Optionally, when a light intensity of the reactive gas in the plasma detected by the spectrum analyzer 8 is stable, it indicates that the deposit has been almost etched out and the chamber has been cleaned.

In an alternative embodiment, referring to FIG. 1 and FIG. 2, a probe 8-1 of the spectrum analyzer 8 passes through one hole 1-1 to detect a light intensity.

In an alternative embodiment, referring to FIG. 4, the semiconductor manufacturing equipment further includes: the control device 9 electrically connected to the radio-frequency generator 7 and the spectrum analyzer 8 respectively and configured to control ON/OFF of the radio-frequency generator 7 according to a detection result of the spectrum analyzer 8. Specifically, the spectrum analyzer 8 feeds light intensity data of the etched deposit back to the control device 9, the control device 9 regulates an output of the radio-frequency generator 7, the output of the radio-frequency generator is directly connected to the electrodes 2, and plasma is then generated by control and regulation. Thus, automated control over deposit removal is achieved.

In an alternative embodiment, the spectrum analyzer 8 is adopted to detect a light intensity of a carbon element. Because deposit mainly contains carbides, when the light intensity of the carbon element is less than a predetermined threshold, for example, when the light intensity of the carbon element is close to 0 or 0, it is proved that the deposit has been completely cleaned off. At this point, the control device 9 can switch off the radio-frequency generator 7 to stop cleaning by the plasma, preventing excessive etching from damaging the wafer or the apparatus. On the other hand, if the light intensity of the carbon element in the chamber detected by the spectrum analyzer 8 is higher than the predetermined threshold, the radio-frequency generator 7 is switched on to output a high-frequency signal and a low-frequency signal, so that the electrodes 2 ionize the treating gas to generate plasma again, and the plasma is driven to clean off the deposit.

In an alternative embodiment, the treating gas is a gas containing a fluorine component, and signals generated by the electrodes 2 ionize the treating gas to generate fluorine ions, and a light intensity of a fluorine element in the chamber is detected by the spectrum analyzer 8. Exemplarily, the fluorine ions react with the deposit and are consumed in a large quantity in the process of cleaning. At this point, the concentration of the fluorine ions in the treating gas changes. When the deposit has been completely cleaned off, the fluorine ions are no longer consumed. The light intensity of fluorine detected by the spectrum analyzer 8 will sharply increase, indicating that the deposit has been completely cleaned off. At this point, the control device 9 can switch off the radio-frequency generator 7 to stop cleaning by the plasma, preventing excessive etching from damaging the wafer or the apparatus.

It should be noted that the spectrum analyzer 8 measures the chemical composition of a matter according to spectra emitted by elements. Exemplarily, if a large quantity of fluorine ions is consumed in the process of cleaning, the proportion of the fluorine ions in the treating gas is greatly reduced, that is, the spectrum emitted by the fluorine ions is little. The spectrum analyzer 8 determines the composition of a certain type of matter in the treating gas by acquiring spectrum information, and feeds the acquired data back to the control device 9. The control device 9 as a controller, the spectrum analyzer 8 as a sensor and the electrodes 2 as actuators constitute a closed-loop feedback regulation control.

Figure 5:
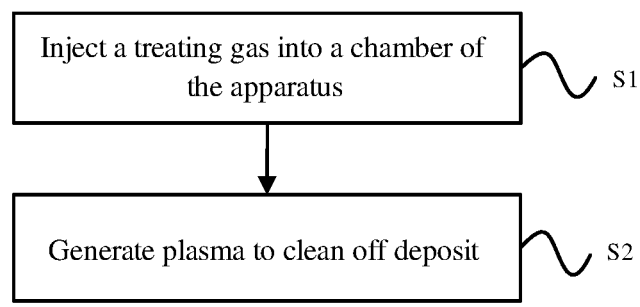
FIG. 5 is a schematic flow chart of a method for cleaning off deposit in a chamber of a semiconductor manufacturing apparatus according to one embodiment of the present application.

FIG. 5 is a schematic flow chart of a method for cleaning off deposit in a chamber of a semiconductor manufacturing apparatus according to one embodiment of the present application.

As shown in FIG. 5, an embodiment of the present application provides a method for cleaning off deposit in a chamber of a semiconductor manufacturing apparatus, and the steps of the method according to the embodiment will be described in detail below.

(Step S1) providing the semiconductor manufacturing apparatus of any of the aforementioned embodiments, and injecting a treating gas into a chamber of the apparatus. Specifically, the treating gas is injected into the chamber of the apparatus, and the treating gas flows from the inner chamber 5 to the outer chamber 6 via the passage 3 communicating the inner chamber 5 with the outer chamber 6. It should be noted that different etching and cleaning processes can be produced by choosing different treating gases. For example, if an inert gas (such as argon) is adopted, the generated plasma mainly reacts with deposit physically; and if oxygen or a fluorine-containing chemically active gas is adopted, the generated plasma mainly reacts with the deposit chemically.

(Step S2) generating plasma to clean off deposit. Specifically, a high-frequency signal and a low-frequency signal are output to the one or more electrodes 2 disposed in the chamber sidewall 6-1, with the high-frequency signal used for ionizing the treating gas coming from the inner chamber 5 to generate plasma and the low-frequency signal used for controlling the plasma to clean off the deposit in the chamber. Exemplarily, the electrodes 2 are electrically connected to the radio-frequency generator 7, the power of the radio-frequency generator 7 is switched on, the power of the radio-frequency generator 7 is set to 500 W, and the radio-frequency generator 7 generates a high-frequency signal and a low-frequency signal. Exemplarily, a frequency of the high-frequency signal ranges from 50 MHz to 70 MHz, preferably 60 MHz. The high-frequency signal causes the electrodes 2 to excite high-frequency electrons, which ionize molecules of the treating gas by impact to generate a large amount of plasma. Exemplarily, the treating gas contains fluorine, and the high-frequency signal of the radio-frequency generator 7 excites the treating gas to generate plasma containing fluorine ions. A frequency of the low-frequency signal ranges from 1 MHz to 3 MHz, preferably 2 MHz. The low-frequency signal is used to control the electrodes 2 to excite low-frequency electrons, and the generated plasma is driven to physically bombard deposit in the region where the electrodes 2 are located, including deposit on the sidewall of the outer chamber 6 where the electrodes 2 are located and deposit on the isolating ring 1.

In an alternative embodiment, the method for cleaning off deposit in a chamber of a semiconductor manufacturing apparatus further includes:

(Step S3) detecting whether the deposit has been completely cleaned off by spectrum analysis. Exemplarily, the spectrum analyzer 8 detects the light intensity of the gas in the chamber after reaction. The spectrum analyzer 8 measures the chemical composition of a matter according to spectra emitted by elements. For example, the spectrum analyzer 8 judges whether the deposit has been completely cleaned off or not by detecting a change in the content of fluorine in the treating gas or a change in the content of a carbon element in the deposit.

It should be understood that the aforementioned specific embodiments of the present application are merely intended to illustrate or explain the principle of the present application rather than constitute a limitation to the present application. Therefore, any modification, equivalent substitution, improvement and the like made without departing from the spirit and scope of the present application shall be included in the protection scope of the present application. In addition, the appended claims of the present application are intended to cover all changes and modifications that fall within the scope and boundaries of the appended claims or equivalents of such scope and boundaries.

Apparently, the aforementioned embodiments are merely examples for clear explanation rather than a limitation to implementations. For those of ordinary skill in the art, other changes or variations in different forms can also be made on the basis of the aforementioned description. All embodiments do not need to and cannot be exhausted herein. However, obvious changes or variations derived therefrom are still within the protection scope created by the present application.

What is claimed is:

1. A semiconductor manufacturing apparatus, comprising:
   a chamber comprising an inner chamber, an outer chamber and a passage communicating the inner chamber with the outer chamber, the passage being located between the inner chamber and a chamber sidewall;
   one or more electrodes disposed in the chamber sidewall and configured to ionize a treating gas coming from the inner chamber to generate plasma so as to clean off deposit produced in the inner chamber; and
   an isolating ring disposed on the chamber sidewall and in the passage and configured to isolate the deposit from contaminating the chamber sidewall;
   wherein the isolating ring is a circular ring disposed around the chamber sidewall, a longitudinal section of the isolating ring is shaped like a C, an upper end of the isolating ring is short, a lower end of the isolating ring is long, a length of the lower end of the isolating ring is greater than or equal to a distance from an edge of the inner chamber to the chamber sidewall, and the lower end of the isolating ring protrudes inward from the chamber sidewall into the passage.

2. The semiconductor manufacturing apparatus of claim 1, wherein
the one or more electrodes are disposed in the chamber sidewall and exposed in the treating gas of the chamber for cleaning off the deposit attached to the chamber sidewall.

3. The semiconductor manufacturing apparatus of claim 1, further comprising:
the one or more electrodes are disposed in the chamber sidewall and configured to generate the plasma to clean off the deposit attached to a surface of the isolating ring.

4. The semiconductor manufacturing apparatus of claim 3, wherein
the isolating ring is provided with an opening, which is configured for transfer of a wafer.

5. The semiconductor manufacturing apparatus of claim 3, wherein
the isolating ring is provided with a plurality of holes, which comprise visible windows.

6. The semiconductor manufacturing apparatus of claim 3, wherein
the isolating ring is a conductor, and is provided with a yttrium oxide coating.

7. The semiconductor manufacturing apparatus of claim 3, wherein
the isolating ring is detachable.

8. The semiconductor manufacturing apparatus of claim 1, further comprising:
a radio-frequency generator electrically connected to the one or more electrodes and configured to supply an oscillating current to the one or more electrodes.

9. The semiconductor manufacturing apparatus of claim 8, wherein
the radio-frequency generator generates a high-frequency signal with a frequency ranging from 50 MHz to 70 MHz for ionizing the treating gas to generate the plasma.

10. The semiconductor manufacturing apparatus of claim 8, wherein
the radio-frequency generator generates a low-frequency signal with a frequency ranging from 1 MHz to 3 MHz for controlling the plasma to clean off the deposit.

11. The semiconductor manufacturing apparatus of claim 5, further comprising:
a spectrum analyzer, a probe of the spectrum analyzer being disposed in one hole of the plurality of holes of the isolating ring for detecting whether the deposit has been completely cleaned off.

12. The semiconductor manufacturing apparatus of claim 11, further comprising:
a control device electrically connected to a radio-frequency generator and the spectrum analyzer respectively and configured to control ON/OFF and a signal frequency of the radio-frequency generator according to a detection result of the spectrum analyzer.

13. The semiconductor manufacturing apparatus of claim 12, wherein
a control mode of the control device is as follows:
when the spectrum analyzer detects that a light intensity is lower than a predetermined threshold, the radio-frequency generator is switched off; and
when the spectrum analyzer detects that the light intensity is higher than the predetermined threshold, the radio-frequency generator is switched on and controlled to generate a high-frequency signal and a low-frequency signal.

14. The semiconductor manufacturing apparatus of claim 1, further comprising:
a suction pump disposed at a bottom of the chamber and configured to pump away the deposit in the chamber.

15. The semiconductor manufacturing apparatus of claim 9, wherein
the radio-frequency generator generates a low-frequency signal with a frequency ranging from 1 MHz to 3 MHz for controlling the plasma to clean off the deposit.

* * * * *